United States Patent
Tojo et al.

(10) Patent No.: US 8,378,479 B2
(45) Date of Patent: Feb. 19, 2013

(54) SEMICONDUCTOR DEVICE AND METHOD FOR FABRICATING SEMICONDUCTOR DEVICE

(75) Inventors: Akira Tojo, Kanagawa-ken (JP); Tomoyuki Kitani, Kanagawa-ken (JP); Kazuhito Higuchi, Kanagawa-ken (JP); Masako Fukumitsu, Kanagawa-ken (JP); Tomohiro Iguchi, Kanagawa-ken (JP); Hideo Nishiuchi, Kanagawa-ken (JP); Kyoto Kato, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/188,124

(22) Filed: Jul. 21, 2011

(65) Prior Publication Data

US 2011/0272817 A1 Nov. 10, 2011

Related U.S. Application Data

(62) Division of application No. 12/553,452, filed on Sep. 3, 2009, now Pat. No. 8,008,773.

(30) Foreign Application Priority Data

Sep. 3, 2008 (JP) ................ 2008-226232
Sep. 1, 2009 (JP) ................ 2009-201415

(51) Int. Cl.
*H01L 23/48* (2006.01)
*H01L 23/52* (2006.01)
(52) U.S. Cl. ........ 257/690; 257/724; 257/750; 257/787; 257/E23.02
(58) Field of Classification Search .......... 257/690, 257/724, 787, E23.01, E23.02, 750
See application file for complete search history.

(56) References Cited

U.S. PATENT DOCUMENTS

| | | | | | |
|---|---|---|---|---|---|
| 4,617,609 | A | * | 10/1986 | Utner et al. ............ | 361/310 |
| 6,005,474 | A | * | 12/1999 | Takeuchi et al. ........ | 338/320 |
| 6,548,437 | B2 | * | 4/2003 | Sato et al. ............. | 501/139 |
| 6,853,074 | B2 | | 2/2005 | Kitae et al. | |

(Continued)

FOREIGN PATENT DOCUMENTS

JP  02-086150  3/1990
JP  06-120076  4/1994

(Continued)

OTHER PUBLICATIONS

Office Action dated Aug. 3, 2011, in Japan Patent Application No. 2009-201415 (with English Translation).

*Primary Examiner* — Nitin Parekh
(74) *Attorney, Agent, or Firm* — Oblon, Spivak, McClelland, Maier & Neustadt, L.L.P.

(57) ABSTRACT

According to an aspect of the present invention, there is provided a semiconductor device, including a semiconductor chip including a first electrode and a second electrode of a semiconductor element, the first electrode and the second electrode being configured on a first surface and a second surface of the semiconductor chip, an encapsulating material encapsulating the semiconductor chip, the surface portion being other than regions, each of the regions connecting with the first second electrodes, each of inner electrodes being connected with the first or the second electrodes, a thickness of the inner electrode from the first surface or the second surface being the same thickness as the encapsulating material from the first surface or the second surface, respectively, outer electrodes, each of the outer electrodes being formed on the encapsulating material and connected with the inner electrode, a width of the outer electrode being at least wider than a width of the semiconductor chip, and outer plating materials, each of the outer plating materials covering five surfaces of the outer electrode other than one surface of the outer electrode being connected with the inner electrode.

1 Claim, 16 Drawing Sheets

U.S. PATENT DOCUMENTS

| | | |
|---|---|---|
| 6,867,133 B2 | 3/2005 | Kanetaka et al. |
| 6,998,532 B2 * | 2/2006 | Kawamoto et al. ........... 174/521 |
| 7,019,396 B2 * | 3/2006 | Sawada et al. ................ 257/724 |
| 7,256,501 B2 | 8/2007 | Okamoto et al. |
| 7,332,757 B2 * | 2/2008 | Kajiwara et al. .............. 257/288 |
| 7,432,594 B2 | 10/2008 | Ashida et al. |
| 7,786,587 B2 | 8/2010 | Hoshino et al. |
| 2001/0026017 A1 * | 10/2001 | Seto .............................. 257/736 |
| 2002/0020896 A1 * | 2/2002 | Ishikawa et al. ............... 257/622 |
| 2006/0198079 A1 | 9/2006 | Shim et al. |
| 2007/0128794 A1 | 6/2007 | Kusano et al. |

FOREIGN PATENT DOCUMENTS

| | | |
|---|---|---|
| JP | 2000-252235 | 9/2000 |
| JP | 2004-165314 | 6/2004 |

* cited by examiner

SEMICONDUCTOR DEVICE AND METHOD FOR FABRICATING SEMICONDUCTOR DEVICE

CROSS REFERENCE TO RELATED APPLICATION

This application is a divisional of and claims the benefit of priority from U.S. Ser. No. 12/553,452, filed Sep. 3, 2009, which claims the benefit of priority from Japanese Patent Applications No. JP2008-226232, filed Sep. 3, 2008, and No. JP2009-201415, filed Sep. 1, 2009; the entire contents of which are incorporated herein by reference.

FIELD OF THE INVENTION

The present invention relates to a semiconductor device and a method for fabricating the semiconductor device, and more particularly, relates to a semiconductor device including a semiconductor chip and a method for fabricating the semiconductor device including the semiconductor chip.

DESCRIPTION OF THE BACKGROUND

A bonding wire electrically connects between a semiconductor chip and an outer electrode in a conventional semiconductor device as a surface-mount device disclosed in Japanese Patent Publication (Kokai) No. 2006-278520. The semiconductor device using wire-bonding is simply shown in FIG. 16, for example, and is explained below.

A semiconductor device 1000 includes a semiconductor chip 1001 having a surface electrode 1001a and a back surface electrode 1001b on the front surface and the back surface, respectively. An outer electrode 1002 is connected to the back surface electrode 1001b of the semiconductor chip 1001 via a conductive material (not shown) and the surface electrode 1001a of the semiconductor chip 1001 is connected to an outer electrode 1003 by a bonding wire 1004. The semiconductor device 1000 is encapsulated to be airproofed by an encapsulation resin 1005. In the semiconductor device 1000, wiring pads 1007 configured on a substrate 1006 are mutually connected via the outer electrodes 1002 and 1003 and a conductive material (not shown).

Further, as a feature of other small-type electronic device, for example, a type as shown in FIG. 17 can be listed. A semiconductor device 1010 is constituted with a stacked capacitor 1011 and a pair of outer electrodes 1012 connected to the both ends of the stacked capacitor 1011, respectively. A semiconductor chip (not shown) is disposed in the stacked capacitor 1011. Five surfaces of the outer electrode 1012 other than the surface connected to the stacked capacitor 1011 act as an electrode. Furthermore, the outer electrode 1012 is disposed on wiring pads 1014 configured on a substrate 1013. As shown in FIG. 17, a solder 1015 is disposed on the wiring pads 1014 and the outer electrode 1012. The substrate 1013 and the semiconductor device 1010 are electrically connected by the solder 1015.

However, the semiconductor device using the bonding wire disclosed in Japanese Patent Publication (Kokai) No. 2006-278520 has problems mentioned below.

Improvement of electrical characteristics of electron devices, for example, has been desired according to popularization of a cell phone or electronics. An electrical resistance of a bonding wire is increased in the semiconductor device by using the bonding wire. Therefore, improvement in electric characteristics is difficult. Furthermore, as shown in FIG. 16, the surface electrode 1001a of the semiconductor chip 1001 is individually connected to the outer electrode 1003. Consequently, decrease of steps in a fabrication process and shortage of takt time cannot be performed so that productivity cannot be improved.

As shown in FIG. 17, the semiconductor device has the structure that the semiconductor chip is encapsulated in the stacked capacitor. The structure can be improved in electric characteristics due to non-bonding wire as compared to the semiconductor device 1000 having the bonding wire.

On the other hand, a problem may occur when the semiconductor chip is encapsulated. The problem is that the semiconductor element in the semiconductor device is failed. The stacked capacitor 1011 is laminated with hard insulators sandwiching as shown in FIG. 17 and is fabricated by thermocompression. When encapsulating the semiconductor chip, a load to the semiconductor chip may provide damages to the semiconductor chip, which leads to degradation of yield in the fabrication process. Furthermore, peeling between the semiconductor chip and the material sandwiching the semiconductor chip at a contacting interface may be generated in reliability test or a shock accompanying with falling, which may lead to degradation of yield in the fabrication process.

Further, next process may be used as an example for a method for fabricating the semiconductor device 1010 as shown in FIG. 17. First, a semiconductor chip configured to be rearranged by forming a street portion with a prescribed interval is resin-encapsulated. Subsequently, holes for connecting between an electrode and an outer electrode 1012 formed on a front surface and a back surface of the semiconductor chip, respectively, are formed in the resin by a laser process. An outer electrode 1012 is formed by plating. Energy, mainly thermal energy, applied by the laser in the laser process to the semiconductor chip can remove a protect film constituted with, for example, Ni, Au or the like as a metal formed on an electrodes on the front surface and the back surface of the semiconductor chip. The state is not good as the electrode. Thickening the protect film can be considered, however, excess material may be necessary. Further, it is necessary to individually form the holes in the all electrodes of the semiconductor chips. Much more time is necessary for the laser process.

When one surface of the semiconductor chip is resin-encapsulated, the encapsulating resin is heated to be hardened and the temperature is lowered down to room temperature in the resin encapsulation. Accordingly, warpage can generate in a work constituted with the wafer and the encapsulating resin.

This invention is carried out to be solved the problem mentioned above. This invention provides the semiconductor device and the method for fabricating the semiconductor device having a structure without using a bonding wire so as to improve electrical characteristics, to retain high reliability, to promote shortage of takt time in the processing steps and to improve productivity by deleting the laser process.

SUMMARY OF THE INVENTION

According to an aspect of the invention, there is provided a semiconductor device, including, a semiconductor chip including a first electrode of a semiconductor element and a second electrode of the semiconductor element, the first electrode being configured on a first surface of the semiconductor chip, the second electrode being configured on a second surface of the semiconductor chip, the second surface being opposite to the first surface of the semiconductor chip, an encapsulating material encapsulating a surface portion of the semiconductor chip, the surface portion being other than regions, each of the regions connecting with the first electrode or the second electrode, inner electrodes, each of the inner electrodes being connected with the first electrode or the second electrode, a thickness of the inner electrode from the first surface or the second surface being the same thickness as the encapsulating material from the first surface or the second surface, respectively, outer electrodes, each of the outer electrodes being formed on the encapsulating material, the outer electrode being connected with the inner electrode, a width of the outer electrode being at least wider than a width of the semiconductor chip, and an outer plating materials, each of the outer plating materials covering five surfaces of the outer electrode other than one surface of the outer electrode being connected with the inner electrode.

Further, another aspect of the invention, there is provided a method for fabricating a semiconductor device, including, forming a first seed layer on one surface of a wafer, coating a first resist on the first seed layer formed on the one surface of the wafer, disposing a first mask over the first resist, the first mask being aligned to a position to form an opening in the first resist, the opening exposing a first electrode which is formed on the one surface of the wafer, exposing the first resist from outside of the first mask, subsequently developing the first resist to form a first hole in the first resist, performing a first plating on the first resist for filling a first plating material to form a first inner electrode, stripping the first resist from the wafer, removing the first seed layer from the wafer by etching, cutting between adjacent first inner electrodes on the wafer till a prescribed position by a dicer, filling a first encapsulating material in a groove formed by cutting using the dicer to encapsulate up to the first inner electrode by the first encapsulating material, grinding the first encapsulating material to expose the first inner electrode, grinding the other surface of the wafer till a prescribed thickness of the semiconductor chip, forming a second seed layer on an exposed surface by the grinding the other surface of the wafer, coating a second resist on the second seed layer disposing a second mask on the second resist, exposing the second resist from outside of the second mask, subsequently developing the second resist to form a second hole in the second resist, performing a second plating on the second resist for filling a second plating material to form a second inner electrode, stripping the second resist from the wafer, removing the second seed layer from the wafer by etching, encapsulating a second encapsulating to cover the second inner electrode, grinding the second encapsulating material to expose the second inner electrode, forming a third seed layer on the first inner electrode and the first encapsulating material, coating a third resist on the third seed layer, disposing a third mask on the third resist, exposing the third resist from outside of the third mask, subsequently developing the third resist to form a third hole in the third resist, performing a third plating on the third resist for filling a third plating material to form a first outer electrode, forming a fourth seed layer on the second inner electrode and the second encapsulating material, coating a fourth resist on the fourth seed layer, disposing a fourth mask on the fourth resist, exposing the fourth resist from outside of the fourth mask, subsequently developing the fourth resist to form a fourth hole in the fourth resist, performing a fourth plating on the fourth resist for filling a fourth plating material to form a second outer electrode, stripping the third resist from the first encapsulating material, stripping the fourth resist from the second encapsulating material, removing the third seed layer and the fourth seed layer by etching, cutting between adjacent first outer electrodes and adjacent second outer electrodes by the dicer to individuate into each semiconductor device, and performing fifth plating on five surfaces of the first outer electrode and five surfaces of the second outer electrode in the individuated semiconductor device.

According to an aspect of the invention, there is provided a semiconductor device, including, a semiconductor chip including a first electrode of a semiconductor element and a second electrode of the semiconductor element, the first electrode being configured on a first surface of the semiconductor chip, the second electrode being configured on a second surface of the semiconductor chip, the second surface being opposite to the first surface of the semiconductor chip, an encapsulating material encapsulating a surface portion of the semiconductor chip, the surface portion being other than the second surface and a region connecting with the first electrode in the first surface, an inner electrode being connected with the first electrode, a thickness of the inner electrode from the first surface being the same thickness as the encapsulating material from the first surface, a first outer electrode being formed on the encapsulating material, the first outer electrode being connected with the inner electrode, a width of the first outer electrode being at least wider than a width of the semiconductor chip, and a second outer electrode being formed on the encapsulating material, the second outer electrode being connected with the second surface including the second electrode, a width of the second outer electrode being at least wider than the width of the semiconductor chip, a first outer plating material covering five surfaces of the first outer electrode other than one surface of the first outer electrode being connected with the inner electrode, and a second outer plating material covering five surfaces of the second outer electrode other than one surface of the second outer electrode being connected with the second outer electrode.

Further, another aspect of the invention, there is provided a method for fabricating a semiconductor device, including, forming a first seed layer on one surface of a wafer, coating a first resist on the first seed layer formed on the one surface of the wafer, disposing a first mask over the first resist, the first mask being aligned to a position to form an opening in the first resist, the opening exposing a first electrode which is formed on the one surface of the wafer, exposing the first resist from outside of the first mask, subsequently developing the first resist to form a first hole in the first resist, performing a first plating on the first resist for filling a first plating material to form an inner electrode, stripping the first resist from the wafer, removing the first seed layer from the wafer by etching, cutting between adjacent inner electrodes on the wafer till a prescribed position by a dicer, filling an encapsulating material in a groove formed by cutting using the dicer to encapsulate up to the inner electrode by the encapsulating material, grinding the encapsulating material to expose the inner electrode, grinding the other surface of the wafer being opposed to the one surface of the wafer till a prescribed thickness of the semiconductor chip, forming a second seed layer on the inner electrode and the encapsulating material, coating a second resist on the second seed layer, disposing a second mask over the second resist, the second mask being aligned to a position to form an opening in the second resist, the opening exposing the inner electrode which is formed on the one surface of the wafer, exposing the second resist from outside of the second mask, subsequently developing the second resist to form a second hole in the second resist, performing a second plating on the second resist for filling a second plating material to form a outer electrode, stripping the second resist from the wafer, forming a third seed layer on the other surface of the wafer, coating a third resist on the third seed layer, disposing a third mask over the third resist, the third mask being aligned to a position to form an opening in the third resist, the opening exposing a second electrode which is formed on the other surface of the wafer, exposing the third resist from outside of the third mask, subsequently developing the third resist to form a third hole in the third resist, performing a third plating on the third resist for filling a third plating material to form a second outer electrode, stripping the third resist from the wafer, removing the second seed layer and the third seed layer by etching, cutting between adjacent first outer electrodes and adjacent second outer electrodes by the dicer to individuate into each semiconductor device, and performing fifth plating on five surfaces of the first outer electrode and five surfaces of the second outer electrode in the individuated semiconductor device.

DETAILED DESCRIPTION OF THE INVENTION

Figure 1:
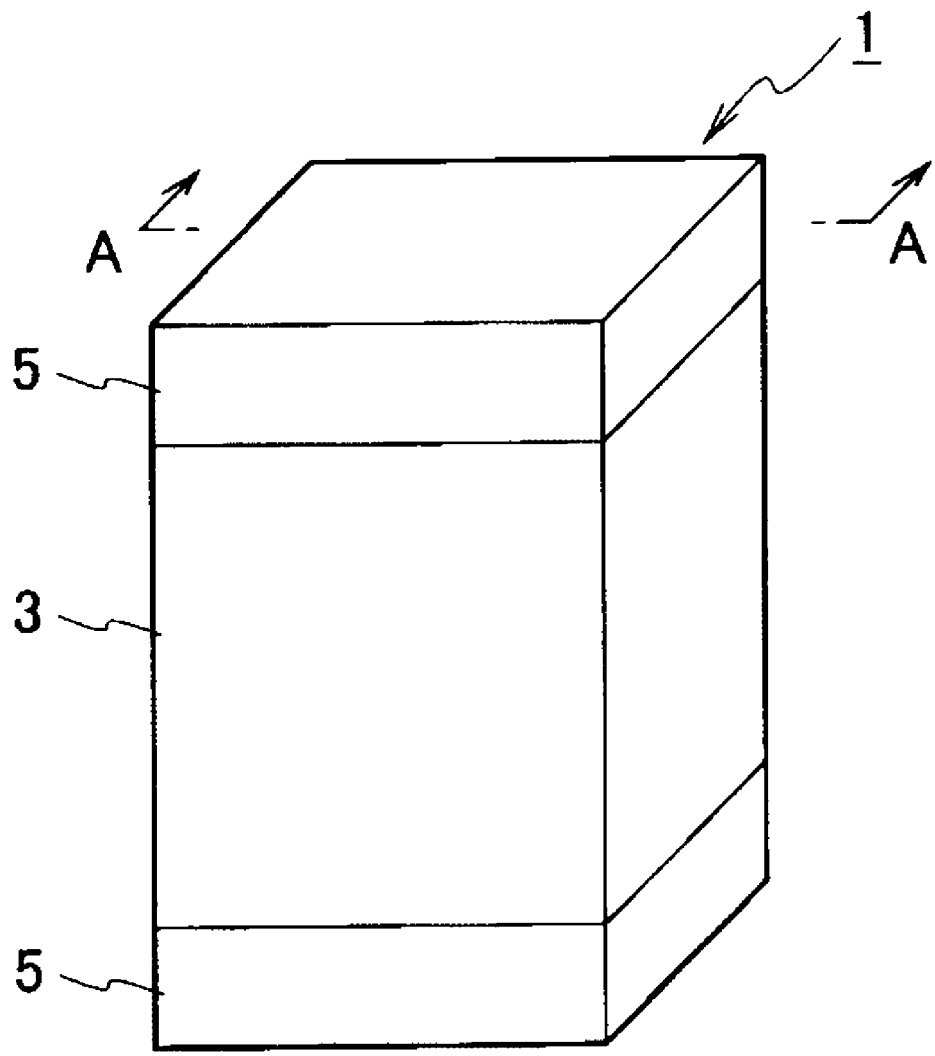
FIG. 1 is an overall view showing a semiconductor device according to a first embodiment of a present invention.

Embodiments of the present invention will be described below in detail with reference to the drawing mentioned above. It should be noted that the present invention is not restricted to the embodiments but covers their equivalents. Throughout the attached drawings, similar or same reference numerals show similar, equivalent or same components.

First Embodiment

First, a semiconductor device according to a first embodiment of the present invention will be described below in detail with reference to FIGS. 1-2. FIG. 1 is an overall view showing the semiconductor device according to the first embodiment of the present invention. As shown in FIG. 1, the semiconductor device has nearly a rectangular parallelepiped shape.

Figure 17:
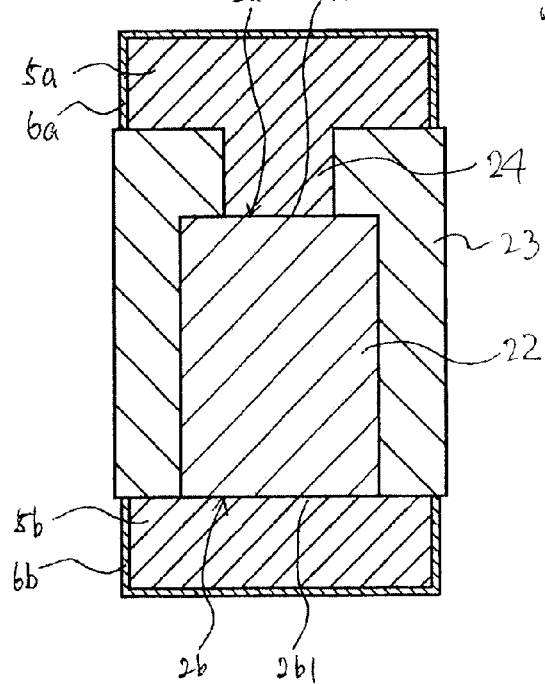
FIG. 17 is a cross-sectional view cut by line B-B in FIG. 1 showing the semiconductor device according to the second embodiment of the present invention.

A pair of outer electrodes 5 is configured in a semiconductor device 1. A portion encapsulated by an encapsulating material 3 is configured in the semiconductor device 1 to be sandwiched between the pair of the outer electrodes 5. The encapsulating material 3 encapsulates a semiconductor chip 2 (not illustrated in FIG. 1) configured in the semiconductor device 1. Each of the outer electrodes 5 is plated to be covered with plating film 4 (not illustrated in FIG. 1). Accordingly, an electrode with five surfaces as an outer electrode is formed on five surfaces of the outer electrodes 5 other than a surface contacting with the encapsulating material 3. A color of the encapsulating material 3 can be arbitrary changed as mentioned later. When the semiconductor chip 2 is encapsulated, polarity of semiconductor device 1 can be represented by using the encapsulating material 3 with different colors. The semiconductor device 1 is used as an aspect as shown in FIG. 17.

Figure 2:
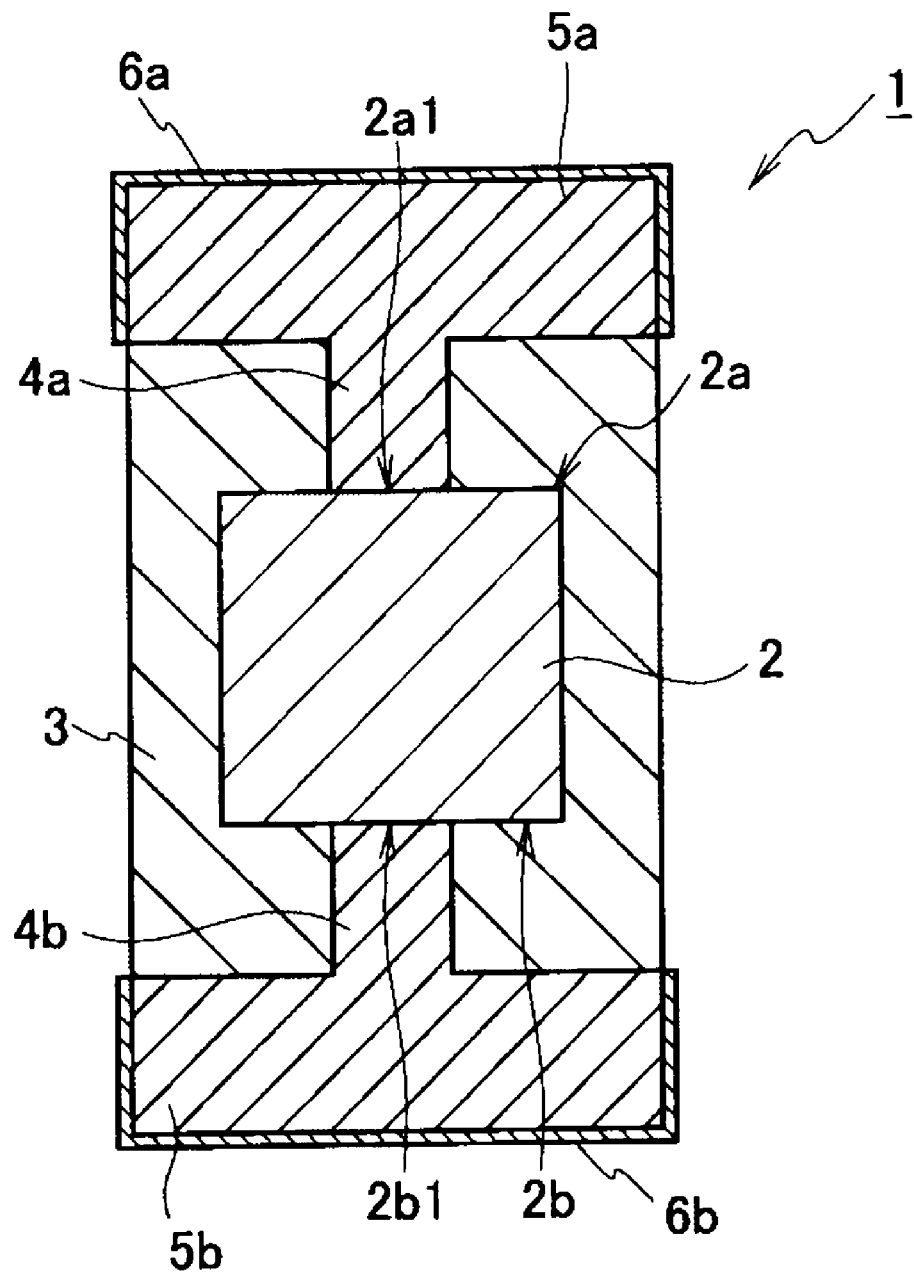
FIG. 2 is a cross-sectional view cut by line A-A in FIG. 1 showing the semiconductor device according to the first embodiment of the present invention.

FIG. 2 is a cross-sectional view cut by line A-A in FIG. 1. The semiconductor chip 2 has nearly the rectangular parallelepiped shape. Four surfaces of the semiconductor chip 2 are configured to be parallel in the longitudinal direction of the semiconductor device 1. The four surfaces are constituted without residual two surfaces formed electrode as mentioned later. A first electrode 2a1 of a semiconductor element is disposed on a first surface 2a of the semiconductor chip 2 and a second electrode 2b1 of the semiconductor element is disposed on a second surface 2b opposed to the first surface 2a. Here, as a matter of convenience for explanation, the first surface 2a and the second surface 2b are specified to be represented as the first electrode 2a1 and the second electrode 2b1 for the electrodes disposed thereon, respectively. Either the first surface 2a or the second surface 2b may be represented as first or second.

As shown in FIG. 2, all the region of the semiconductor chip 2 is encapsulated other than portions configured the first electrode 2a1 and the second electrode 2b1 by an encapsulating material 3. Holes are formed in the portions configured the first electrode 2a1 and the second electrode 2b1 perpendicular direction to the first surface 2a and the second surface 2b. A first inner electrode 4a and a second inner electrode 4b are filled in the holes, respectively. The first inner electrode 4a is connected with the first surface 2a of the semiconductor chip 2 and the second inner electrode 4b is connected with the second surface 2b.

A first outer electrode 5a, and a second outer electrode 5b are formed on the encapsulating material 3 encapsulating the first inner electrode 4a, the second inner electrode 4b and surrounding portions of the first inner electrode 4a and the second inner electrode 4b, respectively. The first outer electrode 5a and the second outer electrode 5b are connected with the first inner electrode 4a and the second inner electrode 4b, respectively. The first outer electrode 5a and the second outer electrode 5b are plated to be covered with outer plating materials 6a and 6b. Consequently, the electrode with five surfaces is formed as mentioned above.

As a result, the semiconductor chip 2 is disposed in nearly a center position of the longitudinal direction of the semiconductor device 1 and sandwiched by the encapsulating material 3 to be encapsulated as shown in FIG. 2. Furthermore, the semiconductor chip 2 is also sandwiched by the first inner electrode 4a and the second inner electrode 4b connected with the first electrode 2a1 and the second electrode 2b1, respectively. The first inner electrode 4a and the second inner electrode 4b are also are sandwiched between the first outer electrode 5a and the second outer electrode 5b.

The encapsulating materials 3 encapsulating the first inner electrode 4a and the second inner electrode 4b is formed as contact surfaces with the inner electrode and the encapsulating material 3, respectively. The contact surfaces are perpendicular to the first surface 2a and the second surface 2b as shown in FIG. 2. The contact surfaces, for example, is tapered from the first surface 2a and the second surface 2b to the outer electrode 5, however, any shape may be applicable about the connection portions. Further, a size of the hole filled with the inner electrode is arbitrarily determined with accompanying characteristics of the semiconductor device 1. Hereafter, both the first inner electrode 4a and the second inner electrode 4b are suitably described as inner electrode 4.

A method for fabricating the semiconductor device according to the first embodiment of the present invention are explained by suitably using FIGS. 3-15 being cross-sectional diagrams of a work.

Figure 3:
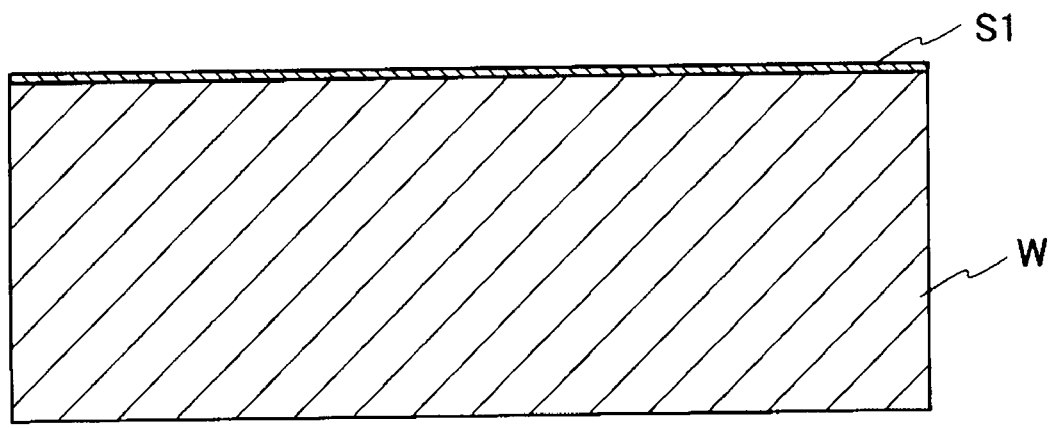
FIG. 3 is a cross-sectional view of a work showing a method for fabricating the semiconductor device according to the first embodiment of the present invention.

First, a wafer W formed the semiconductor element with an element electrode therein is prepared. As shown in FIG. 3, the thicker wafer W is used in the method for fabricating the semiconductor device according to the embodiment in this invention. Generation of warpage in the wafer W can be controlled as lower by using the thick wafer, when the one side of the wafer W is encapsulated by the encapsulating material 3. As mentioned above, the thickness can be arbitrarily determined, however, a thickness of 625 μm as 6-inch-wafer of or a thickness of 725 μm as 8-inch-wafer is favorably used, for example, in the method for fabricating the semiconductor device. Further, the size is suitably used on an explanation after. However, the size is described as an example according to the embodiment in this invention. Accordingly, the size of the semiconductor device is not restricted to the numerical number.

A first seed layer S1 is formed on the one surface of the wafer W which is the first surface 2a. The first seed layer S1 is constituted with, for example, titanium (Ti) or copper (Cu). The work shown in FIG. 3 is a state which the first seed layer S1 is formed on the wafer W. The seed layer S acts as a conductive layer when plating a metal. Accordingly, each seed layer S as shown later is necessary to have a sufficient thickness as a film thickness, when the film is formed. A method forming the film is sputtering, evaporation electroless plating or the like, however, is not restricted. Further, material property of the seed layer S1 is not restricted. For example, the material property of the seed layer S1 can be arbitrarily selected to fit to that of an inner electrode or the like formed later.

In the embodiment of the present invention, pre-heating preliminary heating the work is included in the state. The processing step is aimed to evaporate water in the work and especially the seed layer and to improve an adhesion of a resist adhered on the seed layer S in subsequent processes. However the processing step is not essential.

Figure 4:
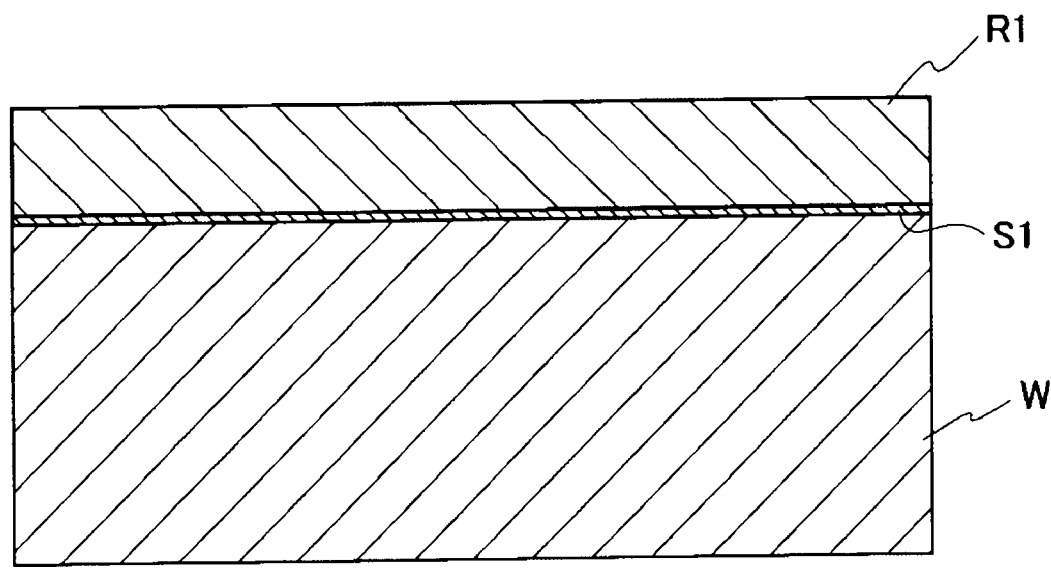
FIG. 4 is a cross-sectional view of the work showing the method for fabricating the semiconductor device according to the first embodiment of the present invention.

As shown in FIG. 4, a first resist R1 is adhered on the first seed layer S1 formed on the one surface of the wafer W. The first resist R1 is used when the inner electrode 4 is formed. Accordingly, a dry film resist (DFR) as a film, a liquid resist or the like can be used in relation to a thickness of the inner electrode 4. The DFR is used in the embodiment of the present invention.

Figure 5:
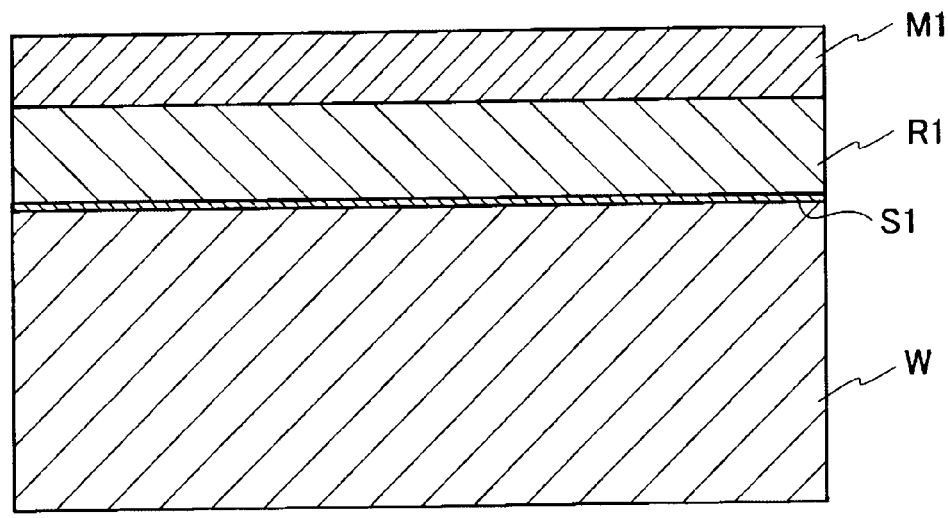
FIG. 5 is a cross-sectional view of the work showing the method for fabricating the semiconductor device according to the first embodiment of the present invention.

As shown in FIG. 5, a mask M1 is disposed on the first resist R1 which is subsequently exposed through the mask M1. Patterns used on the exposure are preliminary formed in the mask M1. The patterns expose a surface of the first electrode 2a1 when the exposure and subsequent developing are performed. Therefore, prescribed positions are aligned to form openings. Here, a glass mask is used and ultraviolet is irradiated to expose. On the other hand, properties of the mask M or light being irradiated can be freely selected in combination with the first resist R1.

Figure 6:
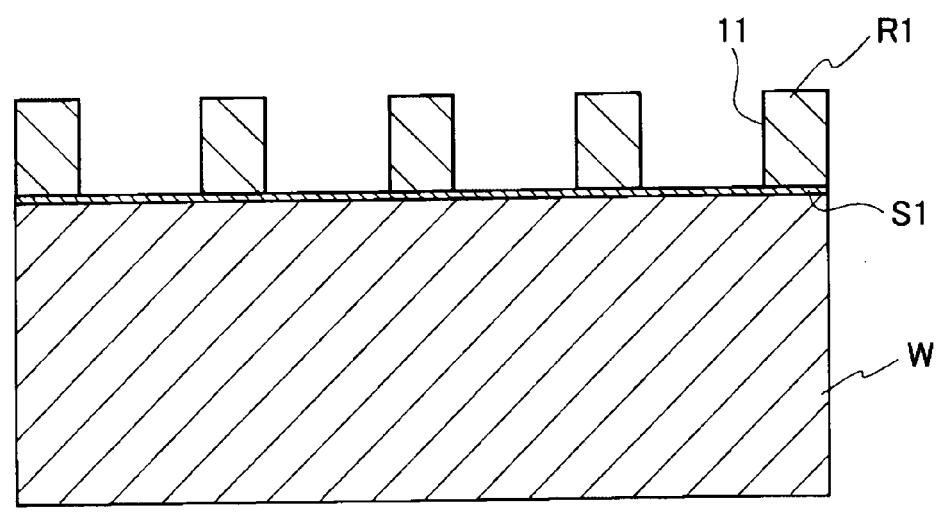
FIG. 6 is a cross-sectional view of the work showing the method for fabricating the semiconductor device according to the first embodiment of the present invention.

As shown in FIG. 6, the first resist R1 is developed to form the patterns, subsequently a residue of the first resist R1 is removed as a scum by a de-scum treatment. Each pattern is the first hole 11 for forming the inner electrode 4. The first holes 11 are formed as a grid on the wafer W after the processing steps. Further, a solution used as a developer can freely be selected with accompanying properties of the first resist R1.

Figure 7:
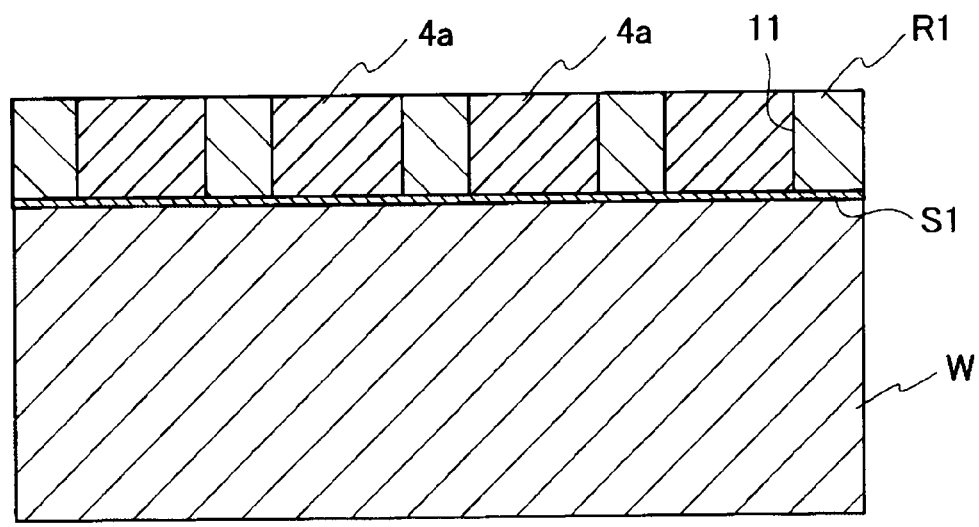
FIG. 7 is a cross-sectional view of the work showing the method for fabricating the semiconductor device according to the first embodiment of the present invention.
Figure 8:
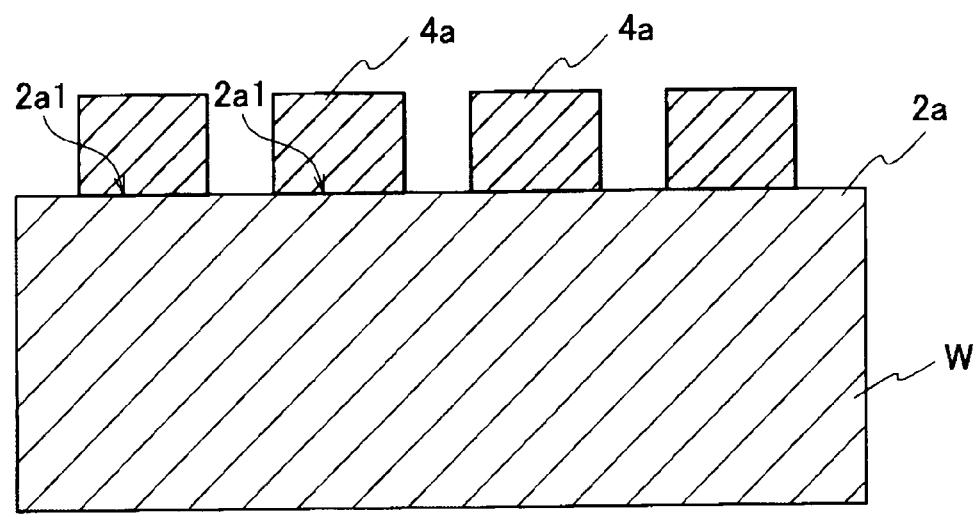
FIG. 8 is a cross-sectional view of the work showing the method for fabricating the semiconductor device according to the first embodiment of the present invention.

As shown in FIG. 7, plating is carried out on the first resist R1 to fill in the first holes 11 formed by the processing step mentioned above. By performing a first plating, a plating material is filled in the first holes 11 to form the first inner electrode 4a. Moreover, electrical plating is performed in the processing step. Cu is used as the plating material. However, any metal may be used as a plating material. Accordingly, the first inner electrode 4a is constituted with Cu. Next, the first resist R1 (DFR) adhered on the first seed layer S1 is stripped. As shown in FIG. 8, first seed layer S1 exposed is also etched with the first resist R1 so as to be stripped from the wafer. In the state, the first inner electrode 4a is formed on the first electrode 2a1 formed on the wafer W. Further, a solution used as a resist stripper and an etching solution used as a seed etcher can freely be selected with accompanying properties of the first resist R1 and the first seed layer S1.

Figure 9:
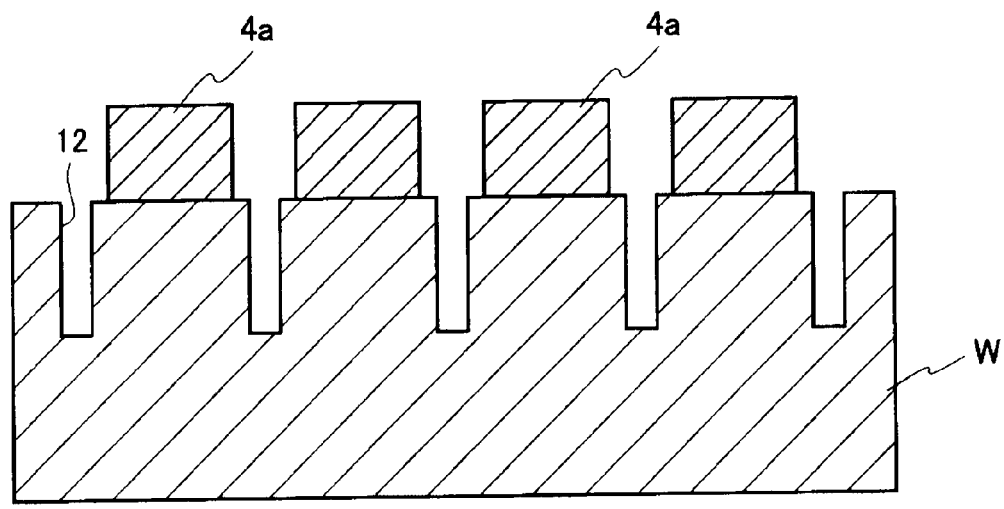
FIG. 9 is a cross-sectional view of the work showing the method for fabricating the semiconductor device according to the first embodiment of the present invention.

As shown in FIG. 9, a portion of the wafer W between adjacent first inner electrodes 4a is cut till a prescribed position by a dicer so that grooves 12 as the grid is formed. The prescribed position can be arbitrarily determined. On the other hand, as the encapsulating material 3 is filled in the grooves 12, an outer size of the semiconductor device 1 is influenced. The thickness of the semiconductor chip 2 is determined by electrical characteristics and an outer size of the semiconductor device 1. A depth of the groove 12 is necessary to be the thickness of the semiconductor chip 2 in minimum. Furthermore, the depth of the groove 12 is necessary over the thickness of the semiconductor chip 2 in consideration with subsequent processing steps. For example, the depth of the groove 12 is formed to be 250 µm deep to the wafer W having a thickness of 625 µm according to the embodiment in the present invention.

Figure 10:
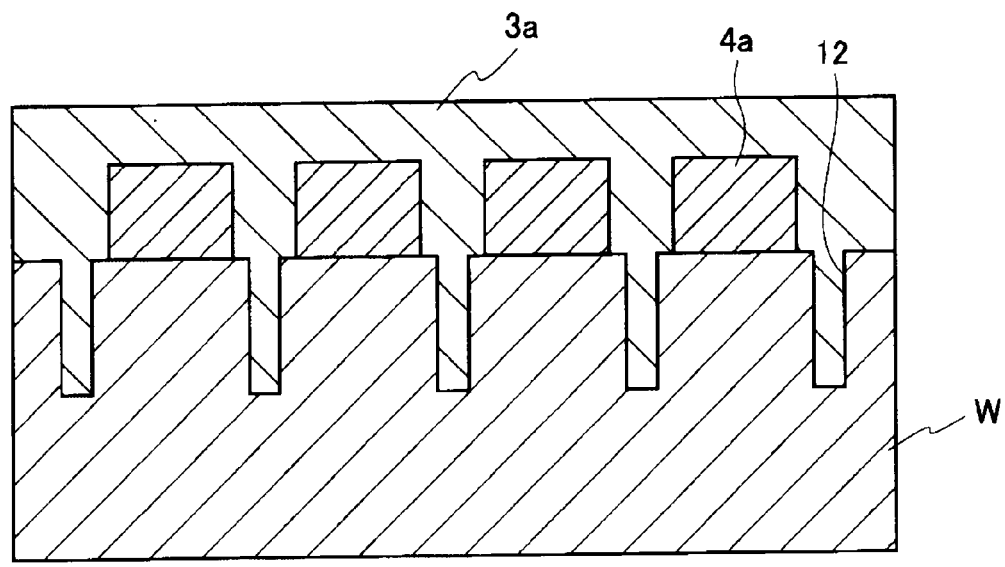
FIG. 10 is a cross-sectional view of the work showing the method for fabricating the semiconductor device according to the first embodiment of the present invention.
Figure 11:
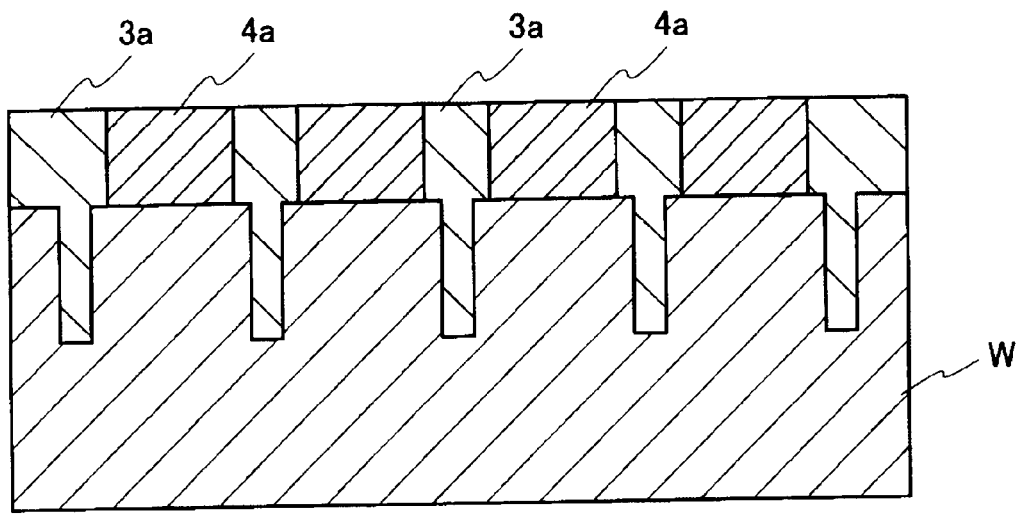
FIG. 11 is a cross-sectional view of the work showing the method for fabricating the semiconductor device according to the first embodiment of the present invention.

As shown in FIG. 10, the grooves 12 are filled and the first encapsulating material 3a is coated on the first inner electrode 4a to resin-encapsulate on the one surface of the wafer W. The first encapsulating material 3a is coated with a sufficient thickness on the first inner electrode 4a. For example, when the thickness of the first inner electrode 4a has a thickness of 100 µm, the thickness of the first encapsulating material 3a is a thickness of 300 µm from the surface of the wafer. Here, the encapsulating material encapsulating the first inner electrode 4a is called the first encapsulating material 3a in convenience. As shown in FIG. 11, the first encapsulating material 3 and the first inner electrode 4a are grinded to expose the first inner electrode 4a. The thickness of the first inner electrode 4a in the grinding is controlled.

Figure 12:
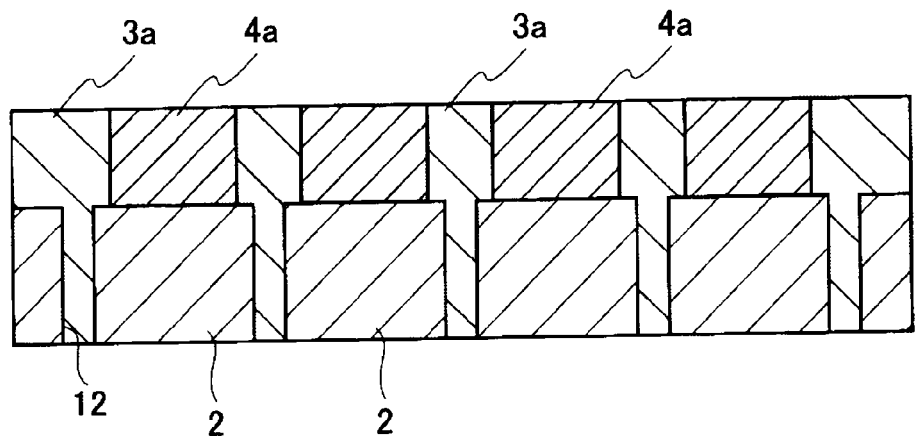
FIG. 12 is a cross-sectional view of the work showing the method for fabricating the semiconductor device according to the first embodiment of the present invention.

As shown in FIG. 12, the other surface of the wafer W is thinned by using a grinder to control the thickness of the wafer in fitting to the prescribed thickness of the semiconductor chip 2. The other surface is not the one surface on which the first inner electrode 4a is encapsulated by the first encapsulating material 3. For example, the thickness of the semiconductor chip 2 is 200 µm thick and the depth of the grooves 12 is 250 µm so that the wafer including the semiconductor devices is individuated into the semiconductor chips. Further, the first encapsulating material 3a filled in the grooves 12 is also exposed on the wafer W thinned by using the grinder.

Next, the other surface of the wafer W is repeatedly performed from forming the second seed layer S2 to grinding the wafer W to expose the second inner electrode 4b as mentioned above. As the processing steps are repeatedly used, new figures are not used but the figures used as explanation on the processing steps in which the semiconductor device 1 are formed on the one surface of the wafer W.

As shown in FIG. 3, a second seed layer S2 is formed on the wafer W. As shown in FIG. 4, a second resist R2 is adhered on the other surface of the wafer W. As shown in FIG. 5, the mask M2 is disposed on the wafer W. As shown in FIG. 6, the wafer W is exposed and is developed to form the patterns on the second resist R2. As shown in FIG. 7, second holes 13 (not shown) formed as the pattern is electrically plated by second plating. As shown in FIG. 8, the second resist R2 and the second seed layer S2 are stripped to form a second inner electrode 4b. As shown in FIG. 10, a second encapsulating material 3b with a prescribed thickness covers the second inner electrode 4b. As shown in FIG. 11, the second encapsulating material 3b is grinded to expose the second inner electrode 4b.

Furthermore, when the second inner electrode 4b is formed, the work is constituted with the semiconductor chip 2 and the first encapsulating material 3a which are different materials each other. Consequently, warpage of the work by heating can be easily generated. Therefore, it is necessary to carefully observe on the work.

Figure 13:
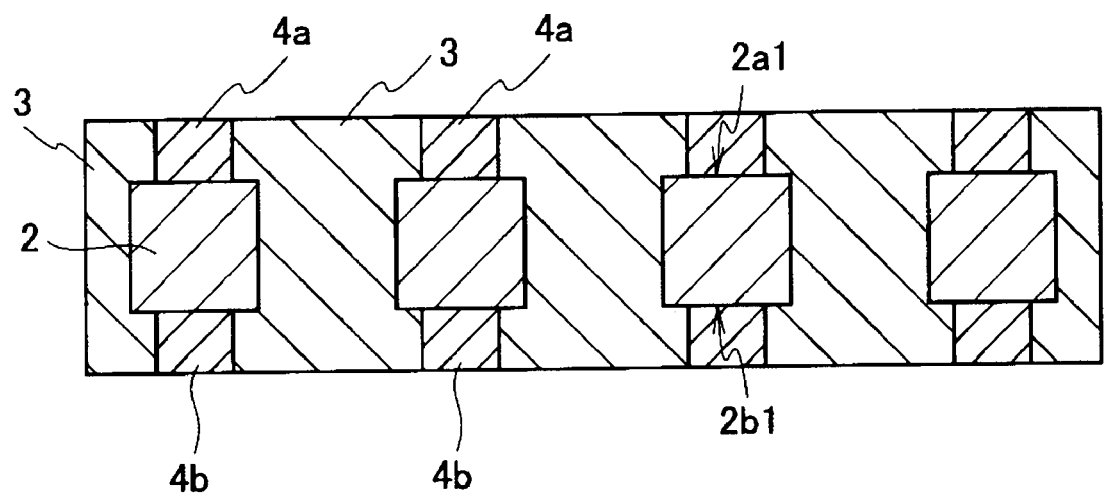
FIG. 13 is a cross-sectional view of the work showing the method for fabricating the semiconductor device according to the first embodiment of the present invention.

As shown in FIG. 13, the first inner electrode 4a and the second inner electrode 4b connecting to the first electrode 2a1 and the second electrode 2b1 of the semiconductor chip 2, respectively, are formed by using the processing steps. The work having a surrounding area of the semiconductor chip 2 and the region being not connected to the inner electrode 4 which are resin-encapsulated by the encapsulating material 3 can be obtained. Accordingly, the method for fabricating the semiconductor device can omit a laser process which forms inner electrode by applying the laser to the encapsulating material 3. Therefore, the method can be prevented from damages on a protecting film by the laser and consuming takt time by the laser processing.

Next, the outer electrode 5 connected to the inner electrode 4 is formed. As mentioned above, the outer electrode 5 is formed by using the resist in the processing step. As shown in FIG. 3, the third seed layer S3 is formed on a surface being exposed the first inner electrode 4a. As shown in FIG. 4, the third resist R3 is adhered on the one surface of the wafer. As shown in FIGS. 5-6, mask M3 is disposed on the wafer W which is subsequently exposed and developed. Consequently, patterns are formed on the third resist R3. As shown in FIG. 7, electrical plating (third plating) is carried out to third holes (not shown) formed as the patterns and the first outer electrode 5a is formed. As the outer electrode 5 is not necessary to be encapsulated by the encapsulating material, for example, forming a groove explained by using FIG. 9 is unnecessary.

Figure 14:
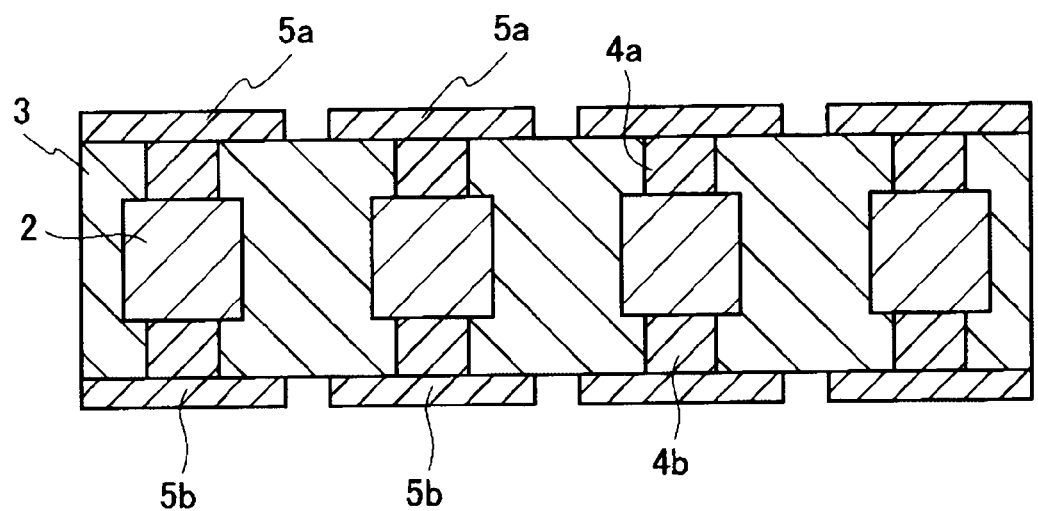
FIG. 14 is a cross-sectional view of the work showing the method for fabricating the semiconductor device according to the first embodiment of the present invention.

Furthermore, inversely the work, the second outer electrode 5b is formed. As mentioned above, the processing steps in fabricating the second outer electrode is the same as the processing steps in fabricating the first outer electrode 5a. As shown in FIG. 3, a fourth seed layer S4 is formed on the surface which the second inner electrode 4b is exposed. As shown in FIG. 4, a fourth resist R4 is adhered on the one surface of the wafer W. As shown in FIGS. 5 and 6, a mask M4 is disposed on the wafer W which is subsequently exposed and developed so that the patterns are formed on the fourth resist R4. Further, electrical plating (fourth plating) is carried out to fourth holes (not shown) formed as the patterns. As shown in FIGS. 7 and 8, a second outer electrode 5b is formed by stripping the third resist R3 and the fourth resist R4 and etching the third seed layer S3 and the fourth seed layer S4. As shown in FIG. 14, the work is formed by the processing steps as mentioned above.

Figure 15:
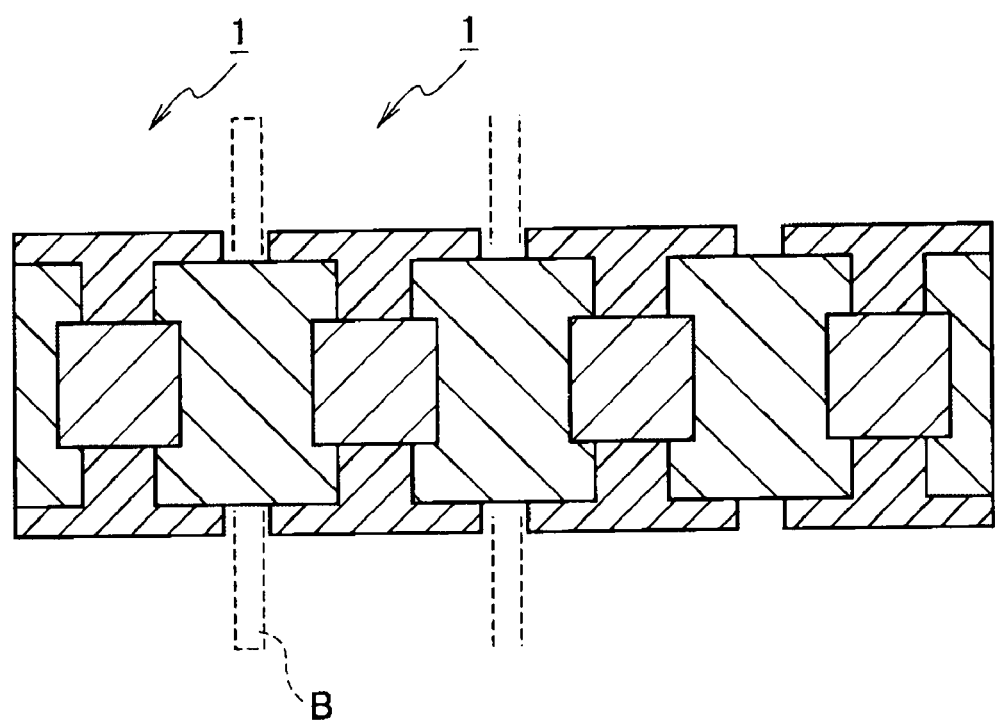
FIG. 15 is a cross-sectional view of the work showing the method for fabricating the semiconductor device according to the first embodiment of the present invention.

As clearly shown in FIG. 14, in the work, a street portion is formed between adjacent outer electrodes 5. The street portion is cut by a dicer to individuate into each semiconductor device 1. As shown in FIG. 15, the state points out that the work is individuated into the chip. Namely, a blade B of the dicer cuts the street portion. A width of the blade B is, for example, 50 µm. When a width of the street portion and the width of the blade B is the same, the blade B may be contacted to the outer electrode 5. Accordingly, the width of the blade B is conventionally narrower than the width of the street portion.

An outer plating material 6, for example, Ni or Sn is formed (fifth plating) on the first outer electrode 5a and the second outer electrode 5b in each of the individuated semiconductor device 1 by using barrel plating. The outer plating material 6 is formed for preventing oxidation of the outer electrode 5 and improvement of wettability of a solder when the substrate is mounted. In this way, the semiconductor device 1 is fabricated as shown in FIG. 1 or FIG. 2.

Furthermore, a stepwise between the encapsulating material 3 and the outer electrode 5 generated in the dicing as mentioned above, is controlled by the film thickness in barrel plating. The encapsulating material 3 and the outer electrode 5 are set as the same plane or the outer electrode 5 is slightly set outside for the encapsulating material 3 to dispose the stepwise, when the semiconductor chip is mounted on the substrate with no problem.

The structure without using the bonding wire is obtained according to the present invention as mentioned above. Accordingly, electrical characteristics of the semiconductor device are improved and reliability of the semiconductor device is retained. Further, the method for fabricating the semiconductor device obtains shortening of the production time to improve productivity by omitting the laser process.

Furthermore, warpage generating of the work is prevented by using a thicker wafer, when the one surface of the wafer is resin-encapsulated. Accordingly, difficulty in feeding the wafer is remarkably decreased so that the method can be contributed with the productivity of the semiconductor device.

Furthermore, as the semiconductor device according to the first embodiment of the present invention uses the electrode with the five surfaces, the semiconductor device also includes superior effects in the mounting processes. Other than the effects mentioned above, for example, the method can provide to visually confirm a solder connection state when the semiconductor device is configured on the substrate. For another example, the solder between the outer electrode and the substrate can be fully formed for a fillet to be decreased breakage failures by external force such as bombardment. Further, a substrate mounting strength can be improved by forming a groove with a line or a cross on the outer electrode using dicing and feeding a solder, for example.

When the first inner electrode 4a and the second inner electrode 4b are formed, the first encapsulating material 3a and the second encapsulating material 3b are used. However, the first encapsulating material 3a and the second encapsulating material 3b can have different collars each other. In the embodiment in this invention, the semiconductor device has the five surfaces of the electrode. When the substrate is mounted, any surface is connected. However, a direction of electrical current of the semiconductor chip is determined in characteristics, the characteristics of the semiconductor device are necessary to be represented. Marking is especially effective. Marking is carried out in the fabricating process, therefore marking is not necessary after individuating into each semiconductor device. Consequently, the fabricating process can be simplified and be improved on the productivity or the like.

Second Embodiment

Next, a semiconductor device according to a second embodiment of the present invention will be described below in detail with reference to FIGS. 16-24.

It is to be noted that the same or similar reference numerals are applied to the same or similar parts and elements throughout the drawings, and the description of the same or similar parts and elements will be omitted or simplified.

A semiconductor device 21 according to the second embodiment is different from the semiconductor device 1 according to the first embodiment on a point that the semiconductor device 21 has not the second inner electrode while the semiconductor device 1 has the second inner electrode. As mentioned above, a second surface having a second electrode is directly connected with a second outer electrode in a semiconductor chip.

The semiconductor device 21 and a method for fabricating the semiconductor device 21 are explained using FIGS. 16-24 as mentioned below.

Figure 16:
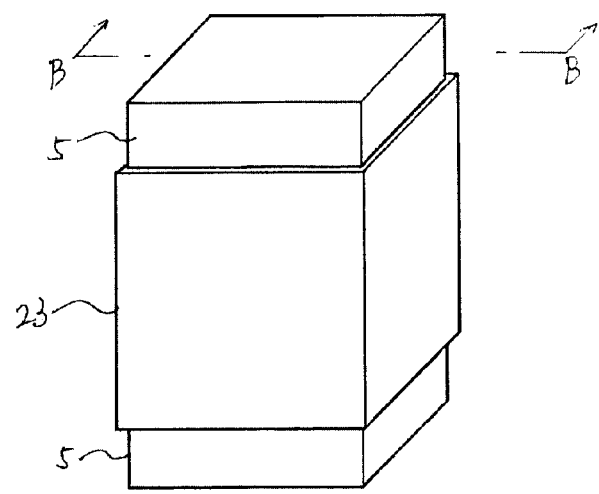
FIG. 16 is an overall view showing a semiconductor device according to a second embodiment of a present invention.

FIG. 16 is an overall view showing the semiconductor device according to the first embodiment of the present invention. As shown in FIG. 16, the semiconductor device has nearly a rectangular parallelepiped shape. A pair of outer electrodes 5 is configured in the semiconductor device 21. A portion encapsulated by an encapsulating material 23 is configured in the semiconductor device 1 to be sandwiched between the pair of the outer electrodes 5. The encapsulating material 23 encapsulates a semiconductor chip 22 (not illustrated in FIG. 16) configured in the semiconductor device 1.

As explained in the first embodiment, a stepwise between the encapsulating material 23 and the outer electrode 5 generated in the dicing which is performed to be finally individuated into a semiconductor chip so as to form the semiconductor device 21. The stepwise can be controlled by the film thickness in barrel plating. However, the outer electrode 5 is slightly set outside for the encapsulating material 23 to dispose the stepwise in the semiconductor device 21 in the second embodiment, for example.

A pair of outer electrodes 5 is configured in a semiconductor device 1. A portion encapsulated by an encapsulating material 23 is configured in the semiconductor device 1 to be sandwiched between the pair of the outer electrodes 5. The encapsulating material 23 encapsulates a semiconductor chip 22 (not illustrated in FIG. 16) configured in the semiconductor device 21. Each of the outer electrodes 5 is plated to be covered with plating film 6 (not illustrated in FIG. 16). Accordingly, an electrode with five surfaces as an outer electrode is formed on five surfaces of the outer electrodes 5 other than a surface contacting with the encapsulating material 23. A color of the encapsulating material 3 can be arbitrary changed.

FIG. 17 is a cross-sectional view cut by line B-B in FIG. 17. The semiconductor chip 22 has nearly the rectangular parallelepiped shape. Four surfaces of the semiconductor chip 22 are configured to be parallel in the longitudinal direction of the semiconductor device 21. The four surfaces are constituted without residual two surfaces formed electrode as mentioned later. A first electrode 2a1 of a semiconductor element is disposed on a first surface 2a of the semiconductor chip 21 and a second electrode 2b1 of the semiconductor element is disposed on a second surface 2b opposed to the first surface 2a. Here, as a matter of convenience for explanation, the first surface 2a and the second surface 2b are specified to be represented as the first electrode 2a1 and the second electrode 2b1 for the electrodes disposed thereon, respectively. Either the first surface 2a or the second surface 2b may be represented as first or second.

As shown in FIG. 7, all the region of the semiconductor chip 22 is encapsulated other than a portion configured the first electrode 2a1 and the second surface including the second electrode 2b1 by an encapsulating material 23. Holes are formed in the portion configured the first electrode 2a1 perpendicular direction to the first surface 2a. The holes are filled with a plating material by plating to form an inner electrode 24. The inner electrode 24 is connected with the first surface 2a of the semiconductor chip 22.

On the other hand, holes are not formed in the portion of the second surface 2b including the second electrode 2b1. A second outer electrode is directly connected with the second electrode 2b1 as mentioned above.

A first outer electrode 5a is formed on the encapsulating material 23 encapsulating the inner electrode 24, and surrounding portions of the inner electrode 24. Accordingly, the first outer electrode 5a is connected with the inner electrode 24. The first outer electrode 5a is plated to be covered with outer plating material 6a.

Consequently, the electrode with five surfaces is formed as mentioned above.

A second outer electrode 5b is formed on the encapsulating material 23 encapsulating the second surface including the second electrode 2b1 and a portion surrounding the semiconductor chip 22. Further, the encapsulating material 23 is formed to be in the same plane as the second surface. Accordingly, the second outer electrode 5b is connected with the second electrode inner electrode 2b1. The second outer electrode 5b is plated to be covered with outer plating material 6b. Consequently, the electrode with five surfaces is formed as mentioned above.

As a result, the semiconductor chip 22 is configured with a portion which is from nearly the center along the longitudinal direction of the semiconductor device 21 to a side of the second outer electrode 5b as shown in FIG. 17, as the inner electrode is not formed at a side of the second outer electrode 5b. In other words, the semiconductor chip 22 is sandwiched between the inner electrode 24 connected to the first electrode 2a1 and the second outer electrode 5b. Furthermore, an area other than the second surface 2b including the second electrode 2b1 and the first electrode 2a1 are encapsulated by the encapsulating material 23. In addition, the inner electrode 24 is connected to the first outer electrode 5a.

The encapsulating material 23 encapsulating the inner electrode 24 is formed as a contact surface with the inner electrode 24. The contact surface is perpendicular to the first surface 2a as shown in FIG. 17. The contact surface, for example, is tapered from the first surface 2a to the outer electrode 5a, however, any shape may be applicable about the connection portions. Further, a size of the hole filled with the inner electrode 24 is arbitrarily determined with accompanying characteristics of the semiconductor device 21.

A method for fabricating the semiconductor device according to the second embodiment of the present invention are explained by suitably using FIGS. 18-24 being cross-sectional diagrams of a work. In this explanation, a method for forming the inner electrode 24 is the same as the method for forming the first inner electrode 4a in the first embodiment as shown in FIGS. 3-8. Accordingly, the explanation on the method for forming the inner electrode is omitted.

Figure 18:
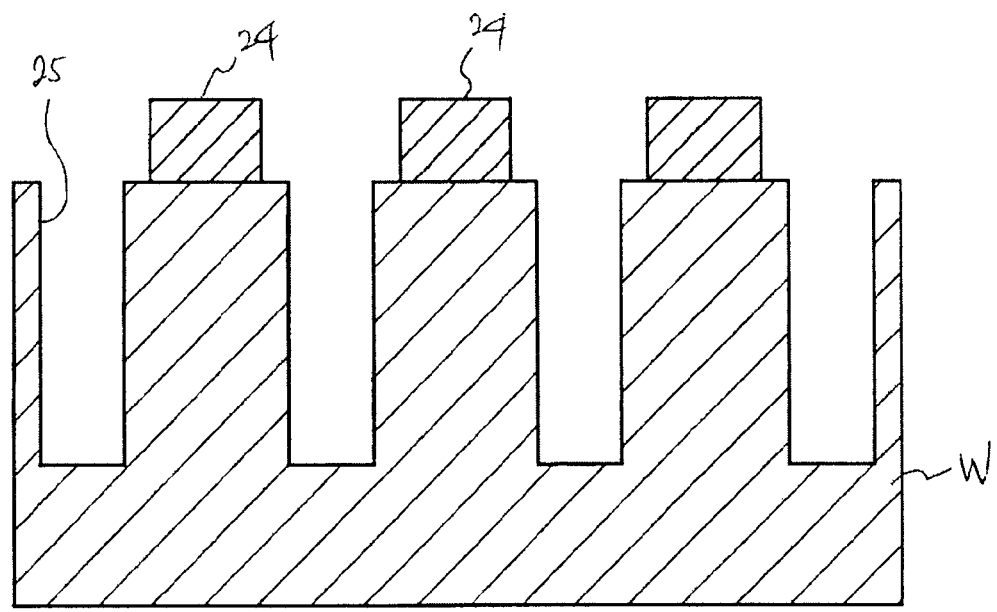
FIG. 18 is a cross-sectional view of a work showing a method for fabricating the semiconductor device according to the second embodiment of the present invention.

After forming the inner electrode, a portion of the wafer W between adjacent inner electrodes 24 is cut till a prescribed position by a dicer so that grooves 25 as the grid is formed as shown in FIG. 18. The prescribed position can be arbitrarily determined. On the other hand, as the encapsulating material 23 is filled in the grooves 25, an outer size of the semiconductor device 21 is influenced. The thickness of the semiconductor chip 22 is determined by electrical characteristics and an outer size of the semiconductor device 21. A depth of the groove 25 is necessary to be the thickness of the semiconductor chip 22 in minimum. Furthermore, the depth of the groove 25 is necessary over the thickness of the semiconductor chip 22 in consideration with subsequent processing steps. For example, the depth of the groove 25 is formed to be 350 μm deep to the wafer W having a thickness of 625 μm according to the second embodiment.

In addition, a thickness or a depth is pointed out as numeral values for example in convenience for understanding, however, these values are only pointed out for example. The numeral values can be changed corresponding to desired specifications in a fabricating process.

Figure 19:
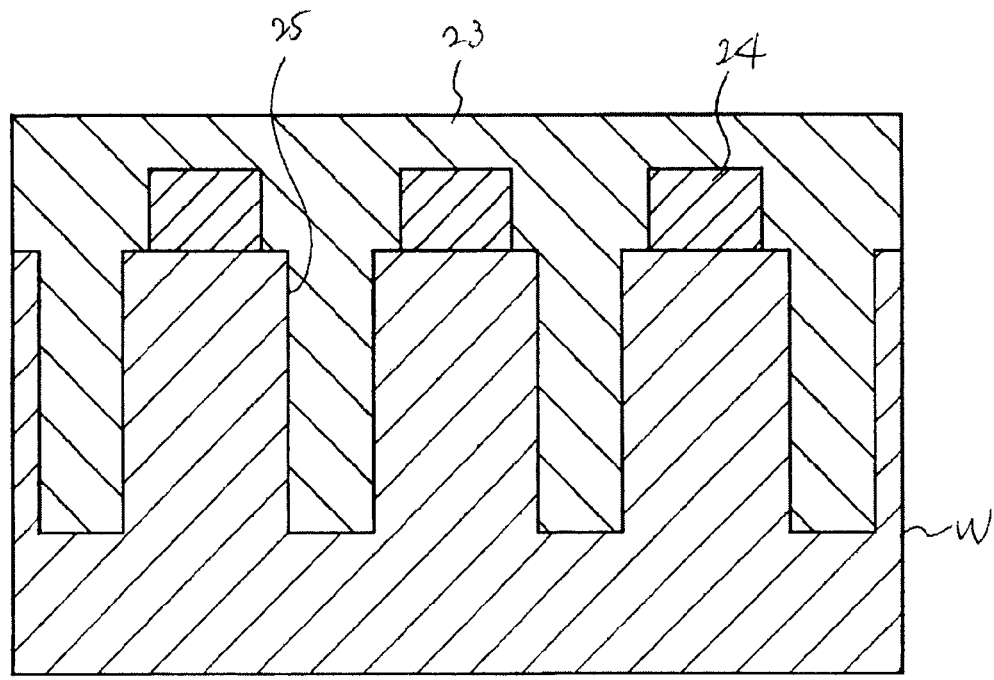
FIG. 19 is a cross-sectional view of a work showing a method for fabricating the semiconductor device according to the second embodiment of the present invention.
Figure 20:
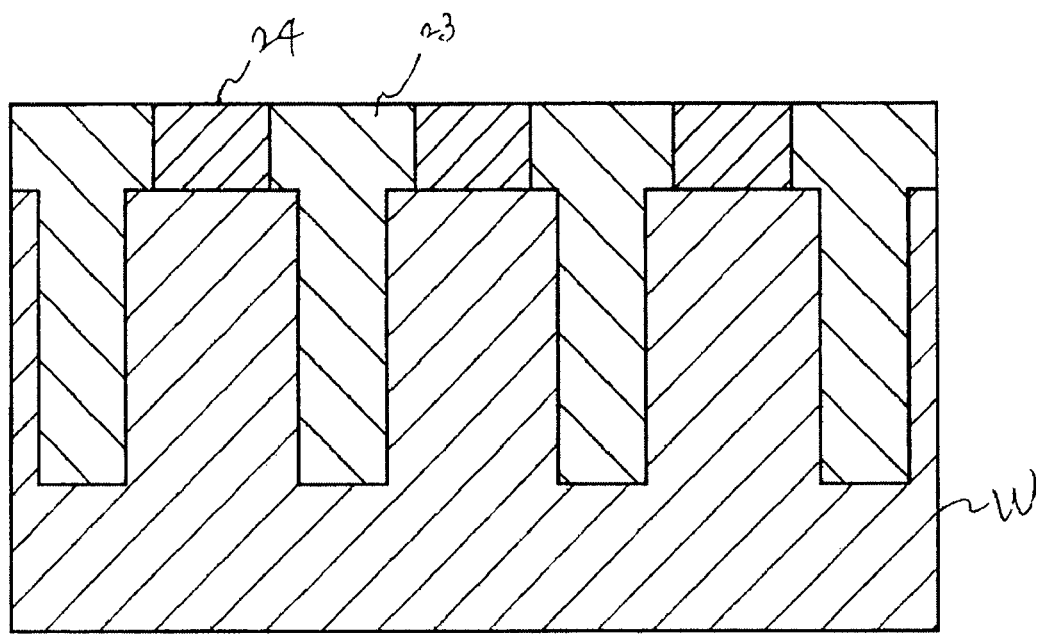
FIG. 20 is a cross-sectional view of a work showing a method for fabricating the semiconductor device according to the second embodiment of the present invention.

As shown in FIG. 19, the grooves 25 are filled and the encapsulating material 23 is coated on the inner electrode 24 to resin-encapsulate on the one surface of the wafer W. The encapsulating material 23 is coated with a sufficient thickness on the inner electrode 24. For example, when the thickness of the first inner electrode 24 has a thickness of 100 μm, the thickness of the encapsulating material 23 is a thickness of 300 μm from the surface of the wafer. As shown in FIG. 20, the encapsulating material 23 and the inner electrode 24 are grinded to expose the inner electrode 24 so as to be in the same plane each other. The thickness of the inner electrode 24 in the grinding is controlled.

Figure 21:
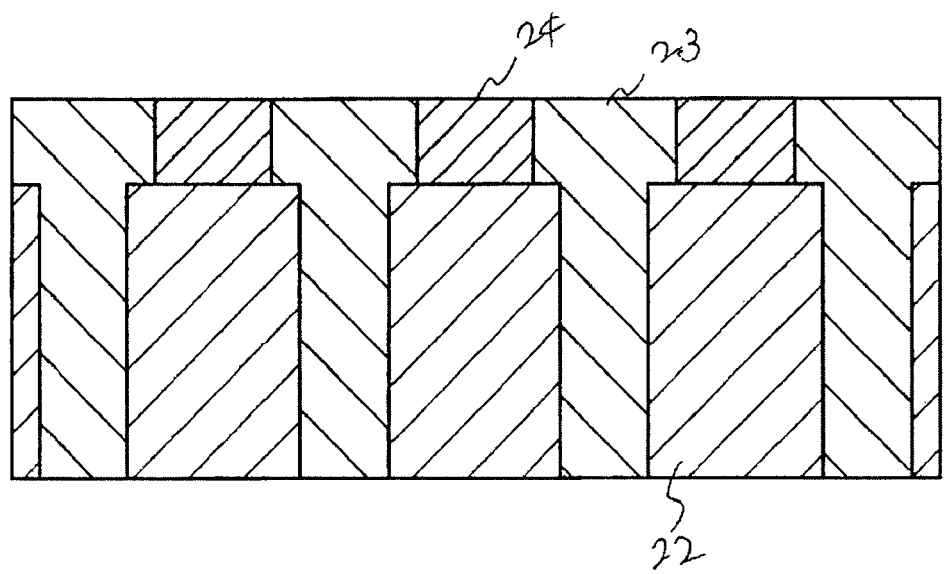
FIG. 21 is a cross-sectional view of a work showing a method for fabricating the semiconductor device according to the second embodiment of the present invention.

As shown in FIG. 21, the other surface of the wafer W is thinned by using a grinder to control the thickness of the wafer in fitting to a prescribed thickness of the semiconductor chip 22. The other surface is not the one surface on which the inner electrode 24 is encapsulated by the encapsulating material 23. For example, the thickness of the semiconductor chip 22 is 300 μm thick and the depth of the grooves 25 is 250 μm deep so that the wafer including the semiconductor devices is individuated into the semiconductor chips. Further, the encapsulating material filled in the grooves 25 is also exposed on the wafer W thinned by using the grinder.

The steps from the forming the second seed layer S2 to the grinding to expose the second inner electrode are repeated to be performed to the other surface of the wafer in the first embodiment as mentioned above. However, the forming the second inner electrode as the semiconductor device 1 of the first embodiment is not included in the semiconductor device 21 of the second embodiment. Consequently, the steps from the forming the second seed layer S2 to the grinding to expose the second inner electrode are omitted.

As shown in FIG. 21, the inner electrode 24 and connecting to the first electrode 2a1 in the semiconductor chip 22 is formed by using the processing steps. The work having the inner electrode 24 which is connected to the first electrode 2a1 in the semiconductor chip 22 can be obtained. The encapsulating material 23 resin-encapsulates on the all area of the semiconductor chip 22 other than the inner electrode 24 exposed from the encapsulating material 23 by the grinding and the second surface in the work.

Accordingly, the method for fabricating the semiconductor device can omit a laser process which forms inner electrode by applying the laser to the encapsulating material 23. Therefore, the method can be prevented from damages on a protecting film by the laser and consuming takt time by the laser processing.

Figure 22:
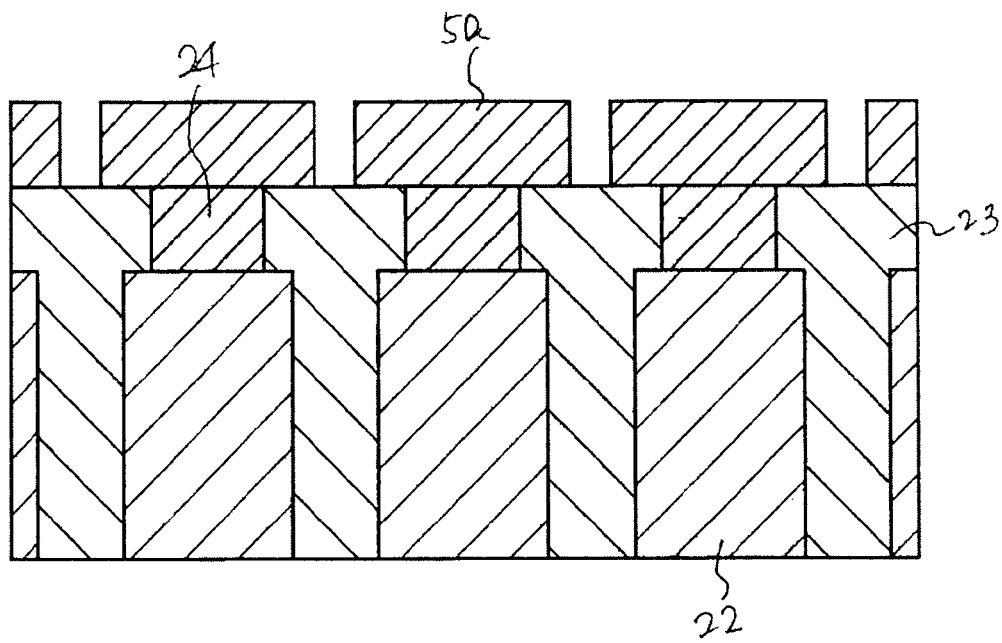
FIG. 22 is a cross-sectional view of a work showing a method for fabricating the semiconductor device according to the second embodiment of the present invention.

Next, a first outer electrode 5a connected to the inner electrode 24 is formed. As mentioned above, the first outer electrode 5a is formed by using the resist in the processing step. As shown in FIG. 3, the second seed layer S2 is formed on a surface being exposed the inner electrode 24. As shown in FIG. 4, the second resist R2 is adhered on the one surface of the wafer. As shown in FIGS. 5-6, mask M3 is disposed on the wafer W which is subsequently exposed and developed. Consequently, patterns are formed on the second resist R2. As shown in FIG. 22, electrical plating (second plating) is carried out to second holes (not shown) formed as the patterns and the first outer electrode 5a is formed. As the first outer electrode 5a is not necessary to be encapsulated by the encapsulating material, for example, forming a groove explained by using FIG. 18 is unnecessary.

Figure 23:
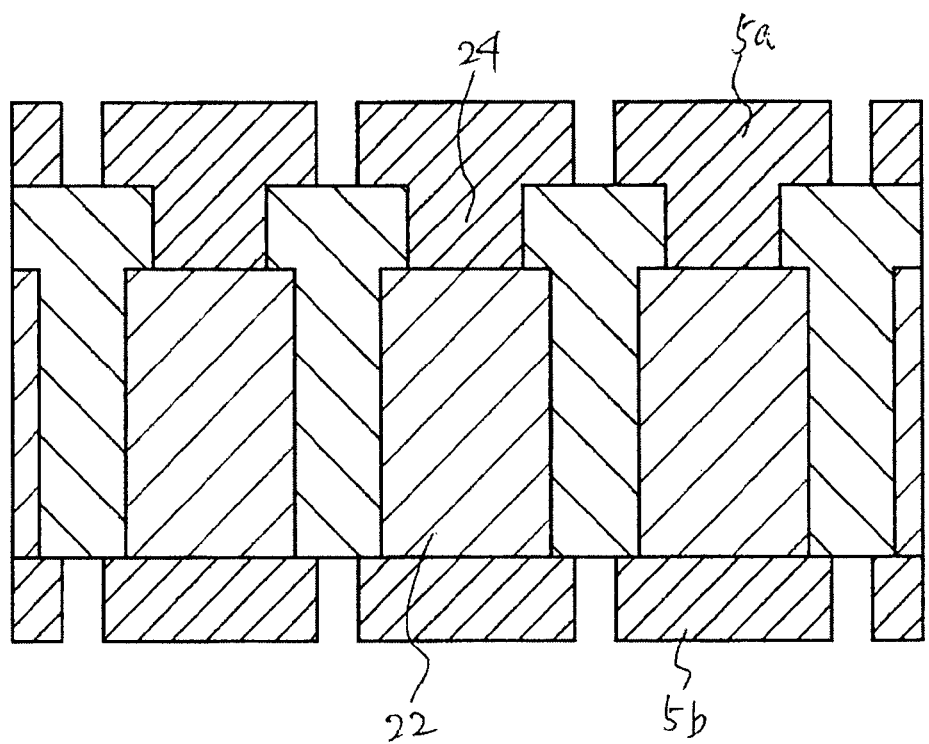
FIG. 23 is a cross-sectional view of a work showing a method for fabricating the semiconductor device according to the second embodiment of the present invention.

Furthermore, inversely the work, a second outer electrode 5b is formed. As mentioned above, the processing steps in fabricating the second outer electrode is the same as the processing steps in fabricating the first outer electrode 5*a*. As shown in FIG. 3, a third seed layer S3 is formed on the surface which the second inner electrode 2*b*1 is exposed. As shown in FIG. 4, a third resist R3 is adhered on the one surface of the wafer W. As shown in FIGS. 5 and 6, the mask M4 is disposed on the wafer W which is subsequently exposed and developed so that the patterns are formed on the third resist R4. Further, electrical plating (third plating) is carried out to third holes (not shown) formed as the patterns. As shown in FIGS. 7 and 8, the second outer electrode 5*b* is formed by stripping the second resist R2 and the third resist R3 and etching the second seed layer S2 and the third seed layer S3. As shown in FIG. 23, the work is formed by the processing steps as mentioned above.

Figure 24:
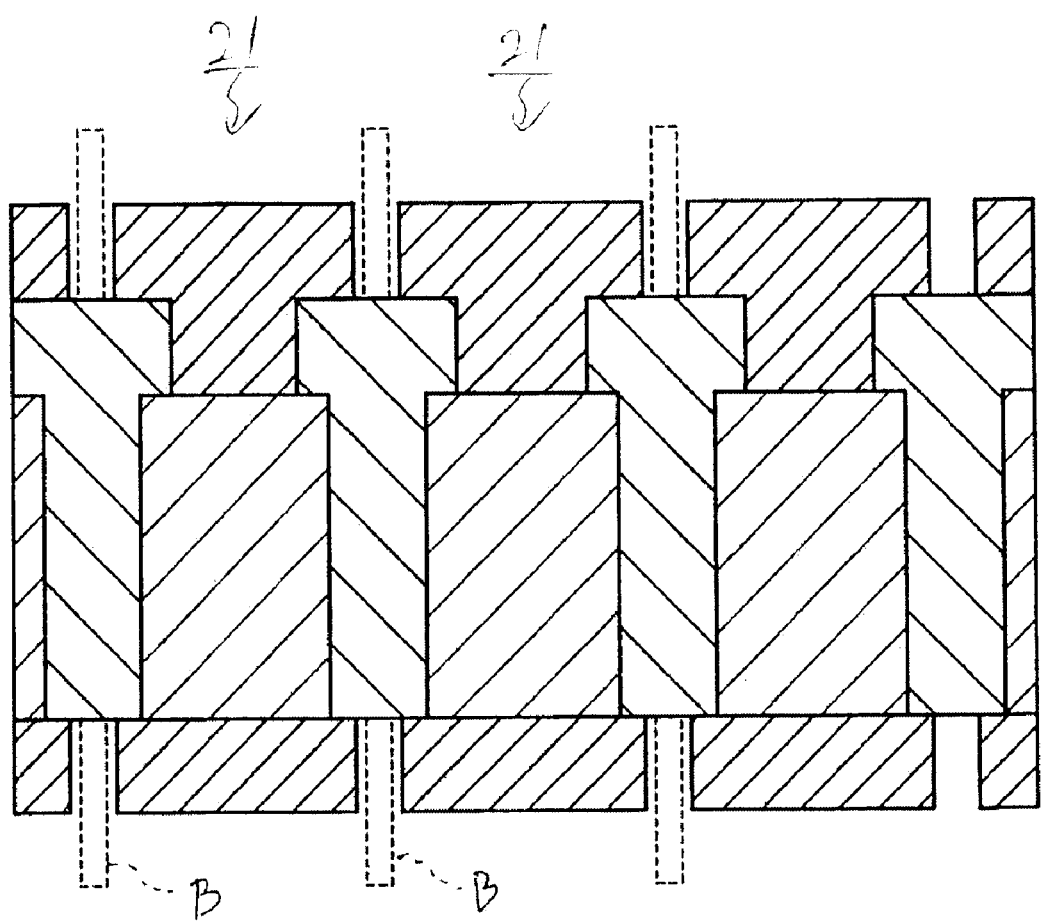
FIG. 24 is a cross-sectional view of a work showing a method for fabricating the semiconductor device according to the second embodiment of the present invention.
Figure 25:
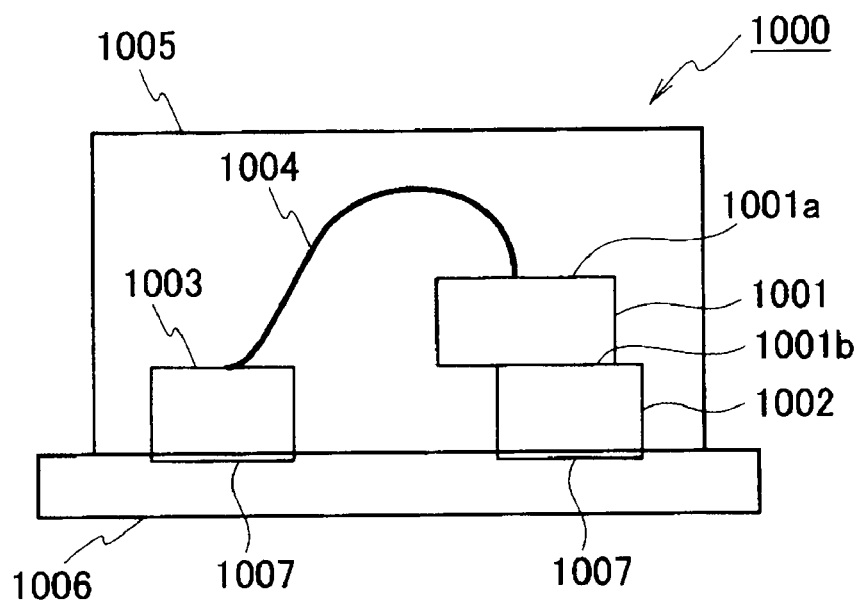
FIG. 25 is a cross-sectional view showing a conventional semiconductor device.
Figure 26:
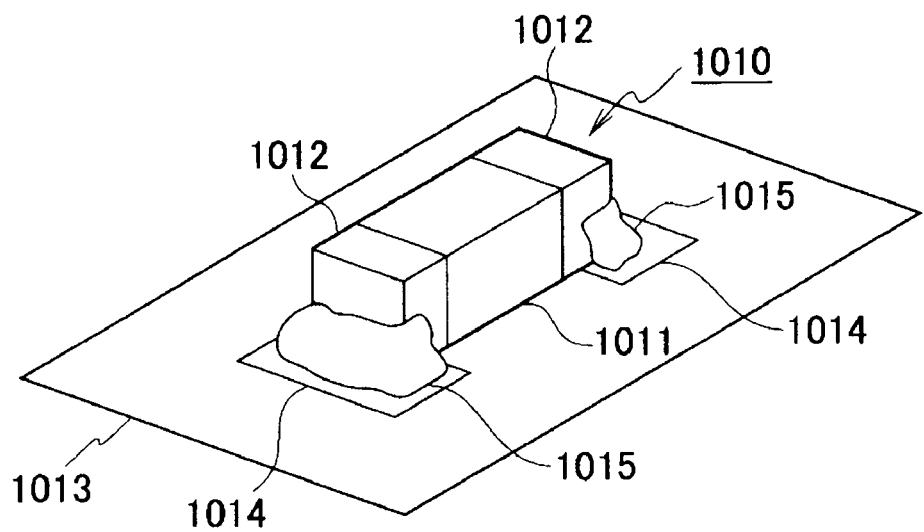
FIG. 26 is a perspective view showing a conventional semiconductor device.

As clearly shown in FIG. 23, in the work, a street portion is formed between adjacent first outer electrodes 5*a* and adjacent second outer electrodes 5*b*, respectively. The street portion is cut by a dicer to individuate into each semiconductor device 21. As shown in FIG. 24, the state points out that the work is individuated into the chip. Namely, a blade B of the dicer cuts the street portion. A width of the blade B is, for example, 50 µm. When a width of the street portion and the width of the blade B is the same, the blade B may be contacted to the outer electrode 5. Accordingly, the width of the blade B is conventionally narrower than the width of the street portion.

An outer plating material 6, for example, Ni or Sn is formed (fourth plating) on the first outer electrode 5*a* and the second outer electrode 5*b* in each of the individuated semiconductor device 21 by using barrel plating. The outer plating material 6 is formed for preventing oxidation of the first outer electrode 5*a* and the second outer electrode 5*b*, and improvement of wettability of a solder when the substrate is mounted. In this way, the semiconductor device 21 is fabricated as shown in FIG. 16 or FIG. 17.

The structure without using the bonding wire is obtained according to the present invention as mentioned above. Accordingly, electrical characteristics of the semiconductor device are improved and reliability of the semiconductor device is retained. Further, the method for fabricating the semiconductor device obtains shortening of the production time to improve productivity by omitting the laser process.

Especially, as difference with the first embodiment, forming the second inner electrode connected to the second electrode in the semiconductor chip can be omitted by grinding the semiconductor chip to be thicker. In the words, series processing steps at the second surface side can be omitted such as forming the inner electrode, encapsulating the resin, grinding the wafer or the like. As a result, processing steps can be markedly reduced in a full fabrication process in packaging, which leads to shortening of the production time to improve productivity.

Furthermore, a material is not newly added when a thick semiconductor chip is used. The thickness is retained by decreasing grinding amount of a wafer which is originally grinded to be disposed. Moreover, various kinds of materials, for example, cu as the material for the inner electrode, can be reduced to suppress a material cost and further to decrease a production cost without forming the inner electrode on the second surface of the semiconductor chip.

As electrical characteristics of the semiconductor chip are dependent on the thickness of the semiconductor chip, electrical resistance may be larger by grinding thicker on the semiconductor chip. However, decrease of performance is not observed in the semiconductor device according to the second embodiment as compared the semiconductor device according to the first embodiment in experimental results by Applicants when the semiconductor chip has a thickness of 300 µm as described in the second embodiment.

Furthermore, coating the resin and heating the resin to be hardened in the second embodiment can be reduced as forming the inner electrode on the second surface of the semiconductor chip is omitted. This situation basically prevents the work from warpage generation when the inner electrode on the second surface of the semiconductor chip is formed. Consequently, warpage generation of the work is prevented when encapsulating one surface of a thick wafer. Further, difficulty in feeding the wafer can be markedly decreased. As a result, the method according to the second embodiment contributes to improve productivity of a semiconductor device.

Furthermore, The processing steps are proceeded as an encapsulation state after grinding the wafer in the second embodiment as shown in FIG. 21. On the other hand, various kinds of treating chemicals are included in reduced processes such as stripping a resist immersed in a stripper or another wet process. The encapsulation resin may be weakened in strength through the wet processes. Accordingly, decreasing strength of the encapsulation resin which is relation to decreasing strength of the semiconductor device can be suppressed by decreasing the wet processes. Further, the second electrode on the second surface is directly connected to the second outer electrode without forming the inner electrode on the second surface of the semiconductor chip. As compared to contacting between the inner electrode formed on the first surface and the first outer electrode, a contact area between the encapsulation material and the outer electrode become small so that the contact strength can be improved on the second surface in the semiconductor chip.

Furthermore, as the semiconductor device according to the first embodiment of the present invention uses the electrode with the five surfaces, the semiconductor device also includes superior effects in the mounting processes. Other than the effects mentioned above, for example, the method can provide to visually confirm a solder connection state when the semiconductor device is configured on the substrate. For another example, the solder between the outer electrode and the substrate can be fully formed for a fillet to be decreased breakage failures by external force such as bombardment. Further, a substrate mounting strength can be improved by forming a groove with a line or a cross on the outer electrode using dicing and feeding a solder, for example.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:
1. A semiconductor device, comprising:
a semiconductor chip including a first electrode of a semiconductor element and a second electrode of the semiconductor element, the first electrode being configured on a first surface of the semiconductor chip, the second electrode being configured on a second surface of the semiconductor chip, the second surface being opposite to the first surface of the semiconductor chip;
an encapsulating material encapsulating a surface portion of the semiconductor chip, the surface portion being other than the second surface and a region connecting with the first electrode in the first surface;

an inner electrode being connected with the first electrode, a thickness of the inner electrode from the first surface being the same as that of the encapsulating material from the first surface;

a first outer electrode being formed on the encapsulating material, the first outer electrode being connected with the inner electrode, a width of the first outer electrode in a lateral direction parallel to the first surface being at least wider than a width of the semiconductor chip in the lateral direction; and a second outer electrode being formed on the encapsulating material, the second outer electrode being connected with the second surface, a width of the second outer electrode at least wider than the width of the semiconductor chip;

a first outer plating material covering five surfaces of the first outer electrode other than one surface of the first outer electrode being connected with the inner electrode; and a second outer plating material covering five surfaces of the second outer electrode other than one surface of the second outer electrode being connected with the second outer electrode.

* * * * *

UNITED STATES PATENT AND TRADEMARK OFFICE
CERTIFICATE OF CORRECTION

| | | |
|---|---|---|
| PATENT NO. | : 8,378,479 B2 | Page 1 of 1 |
| APPLICATION NO. | : 13/188124 | |
| DATED | : February 19, 2013 | |
| INVENTOR(S) | : Akira Tojo et al. | |

It is certified that error appears in the above-identified patent and that said Letters Patent is hereby corrected as shown below:

On the title page, Item (75), the 7th Inventor's First name is incorrect. Item (75) should read:

--(75) Inventors: Akira Tojo, Kanagawa-ken (JP); Tomoyuki Kitani, Kanagawa-ken (JP); Kazuhito Higuchi, Kanagawa-ken (JP); Masako Fukumitsu, Kanagawa-ken (JP); Tomohiro Iguchi, Kanagawa-ken (JP); Hideo Nishiuchi, Kanagawa-ken (JP); Kyoko Kato, Kanagawa-ken (JP)--

Signed and Sealed this
Twenty-third Day of April, 2013

Teresa Stanek Rea
*Acting Director of the United States Patent and Trademark Office*